United States Patent [19]
Matsumoto

[11] Patent Number: 5,290,713
[45] Date of Patent: Mar. 1, 1994

[54] PROCESS OF MANUFACTURING A SEMICONDUCTOR DEVICE BY USING A PHOTORESIST MASK WHICH DOES NOT ENCIRCLE AN AREA OF IMPLANTED IONS

[75] Inventor: Shigeharu Matsumoto, Tokyo, Japan

[73] Assignee: NEC Corporation, Tokyo, Japan

[21] Appl. No.: 882,554

[22] Filed: May 13, 1992

[30] Foreign Application Priority Data

May 15, 1991 [JP] Japan .................................. 110062

[51] Int. Cl.$^5$ ............................................ H01L 21/266
[52] U.S. Cl. ...................................... 437/27; 437/34; 437/229; 148/DIG. 106
[58] Field of Search .................... 437/27, 28, 34, 56, 437/57, 58, 149, 150, 229, 962; 148/DIG. 106

[56] References Cited

U.S. PATENT DOCUMENTS

| | | | |
|---|---|---|---|
| 5,030,582 | 7/1991 | Miyajima et al. | 437/34 |
| 5,032,530 | 7/1991 | Lowrey et al. | 437/57 |
| 5,075,242 | 12/1991 | Nakahara | 437/34 |

Primary Examiner—Brian E. Hearn
Assistant Examiner—C. Chaudhari
Attorney, Agent, or Firm—Burns, Doane, Swecker & Mathis

[57] ABSTRACT

A photoresist mask composed of a plurality of isolated plane patterns having no opening is formed on a main surface of a semiconductor substrate. The breakdown of the gate oxide film due to charge build up can be prevented because no photoresist mask opening patterning is involved.

3 Claims, 3 Drawing Sheets

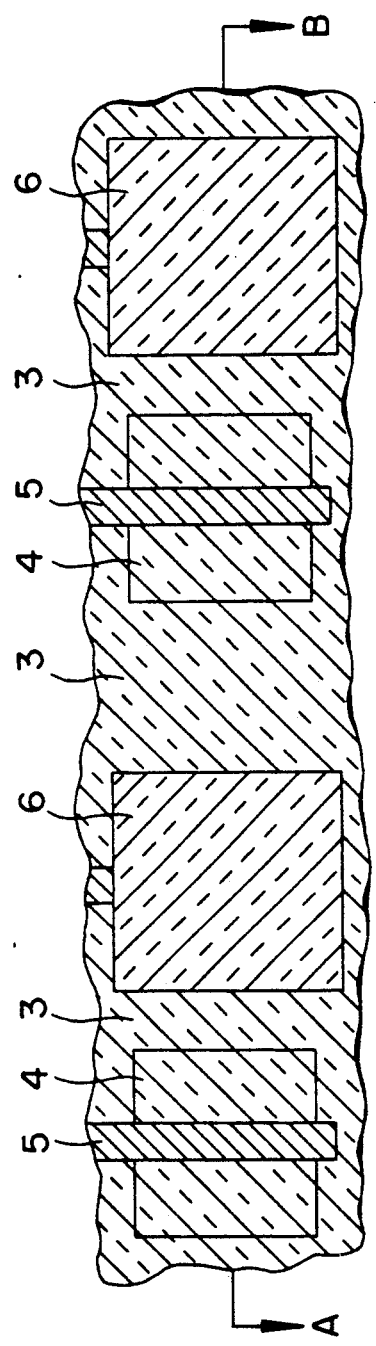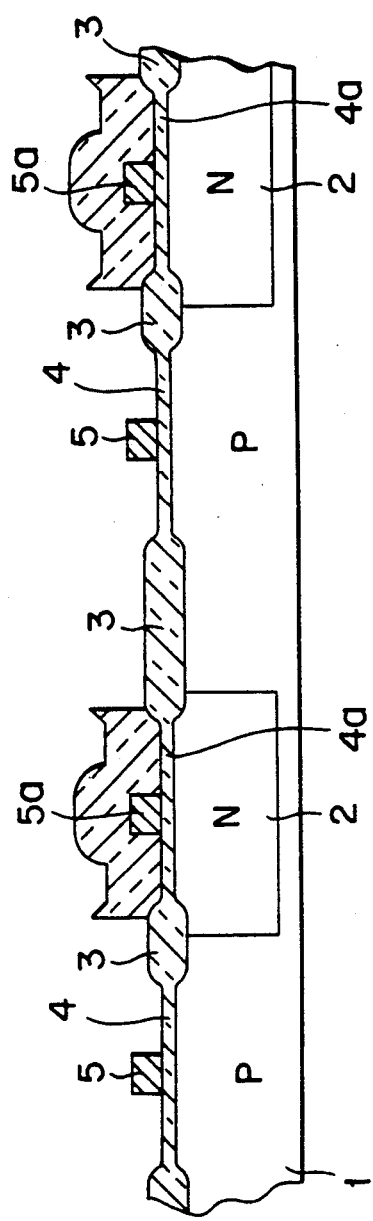
FIG. 3A
FIG. 3B

PROCESS OF MANUFACTURING A SEMICONDUCTOR DEVICE BY USING A PHOTORESIST MASK WHICH DOES NOT ENCIRCLE AN AREA OF IMPLANTED IONS

BACKGROUND OF THE INVENTION

1. Field of the Invention

This invention relates to a process of manufacturing a semiconductor device, and more particularly to a process of manufacturing a semiconductor device which includes an ion implantation step.

2. Description of the Prior Art

Ion implantation is indispensable as a method of doping impurities in the process of manufacturing semiconductor integrated circuits and is employed in the process of manufacturing MOS ICs for formation of the channel stopper of an isolation zone, for control of threshold voltage, for formation of a source-drain and so forth. It is advantageous, particularly in formation of a self-aligned source-drain, that ions can be implanted in a self-aligned condition with a gate electrode made of polycrystalline silicon or the like.

An ion implanting step in formation of a source-drain of a CMOS IC according to the prior art will be described with reference to FIG. 1A and 1B which is a sectional view of FIG. 1A along the line A-B.

First, N-well 2 is formed on P type silicon substrate 1 as shown in FIG. 1B, and then field oxide film 3 for isolation of elements is selectively formed by LOCOS (local oxidation of silicon) selective oxidation. Then, gate oxide films 4 and 4a are formed by thermal oxidation and a polycrystalline silicon film is deposited on the whole surface. Phosphor, which is an N type impurity, is introduced into the polycrystalline silicon film by thermal diffusion, and then the polycrystalline silicon is selectively etched by photolithography to form gate electrodes 5 and 5a.

Subsequently, a source and a drain are formed. Ions of arsenic are selectively implanted into source-drain regions for an N channel FET, and then, the ions of boron are selectively implanted into source-drain regions for the P channel FET.

FIGS. 1A and 1B illustrate a source-drain forming step for an N channel FET, that is, an arsenic ion implanting step. In the prior art, photoresist 6 is so patterned that it is open only to the N channel FET region, that is, the arsenic ion implanting area 10 as shown in FIG. 1B.

An ion implanting step is carried out in the formation of an ohmic layer in a source-drain region according to the prior art when a wiring of a CMOS IS is formed, will be described with reference to FIG. 1C and FIG. 1D, which is a sectional view of FIG. 1C along the line A-B. Source 8, 8a and drain 9, 9a of a MCOS IC are formed. Subsequently, the interlayer insulating film 7 is formed, as shown in FIG. 1D, and then etched by photolithography to form contact holes for wiring.

Then, ions of phosphor are selectively implanted into the N channel FET area and ions of boron are selectively implanted into the P channel FET area in order to form ohmic layers in sources 8 and 8a and drains 9 and 9a.

FIGS. 1C and 1D illustrate an ohmic layer forming step for source 8a and drain 9a for a P channel FET, that is, a boron ion implanting step. In the prior art, photoresist 6 is so patterned that it is open only to contact holes 11a and 11b of the P channel FET into which ions of boron are to be implanted as shown in FIG. 1C.

Photoresist masks are used for selective ion implantation in the formation of a source-drain for an N channel FET and the formation of a source-drain for a P channel FET. Since photoresist is a high insulator, the surface potential thereof is raised by irradiation of charged particles such as ion implantation (the phenomenon will be hereinafter referred to as charge-up). For this reason, there arises a problem that when a high or medium concentration of ions is implanted for the formation of the source-drain region, the potential at the gate electrode is raised, exceeding the isolation voltage of a gate oxide film due to charge-up of a photoresist surface, thereby destroying the gate oxide film. Further, if ion implantation is performed through the opened photoresist in the case of the formation of the source-drain region, the surface of the photoresist is charged up, and moreover, since charge accumulated in the opening areas is not readily discharged, there is another problem in that the potential around the openings is raised so high that the gate oxide film may be broken. Also when an ohmic layer for formation of wiring to the source-drain areas is formed by ion implantation, the potential of the photoresist around the openings is similarly raised so high that a breakdown of the gate oxide film may occur.

Further, when the size of an opening decreases as miniaturization of the pattern of a semiconductor integrated circuit proceeds, a repulsive force may sometimes act upon the opening to break down the photoresist opening pattern due to the charge accumulated in the surface of the photoresist.

SUMMARY OF THE INVENTION

It is an object of the present invention to provide a process of manufacturing the semiconductor device by which a breakdown of the gate oxide film or a breakdown of the photoresist pattern at an ion implanting step is prevented and a semiconductor integrated circuit having a high reliability can be obtained without deterioration of electric characteristics.

The object of the present invention can be achieved by a process of manufacturing a semiconductor device, which comprises the steps of forming a photoresist mask composed of a plurality of isolated plane patterns having no opening on a main surface of a semiconductor substrate and implanting ions.

When a source-drain layer for an N channel FET of a CMOS IC is to be formed, a photoresist mask which covers over only the P channel FET area is formed, and ions are implanted.

When an ohmic layer is to be formed in source-drain regions of a P channel FET of a CMOS IC, a photoresist mask which covers over only contact holes of the N channel FET area is formed, and ions are implanted into a contact hole for the P channel FET.

When a source-drain is to be formed, a semiconductor substrate is covered with a silicon dioxide film or polysilicon. Also when an ohmic layer for formation of wiring for a source-drain is to be formed by ion implantation, a semiconductor substrate is covered with an interlayer insulating film (for example, a BPSG film). The surface conductivities of the silicon dioxide film, the polysilicon and the BPSG film are very high compared with the surface conductivity of the photoresist. Therefore, if a charge is permitted to be transmitted along the surface of the silicon dioxide film, the polycrystalline silicon or the BPSG film, then the charge on the photoresist or at an opening of the photoresist can escape by way of a wafer holder for the ion implanting equipment.

Thus, a route along which accumulated charge can escape is produced by eliminating a closed opening of the photoresist pattern, and consequently, an otherwise possible breakdown of the gate oxide film or a photoresist pattern can be prevented.

As a result, a breakdown of the gate insulating film and a breakdown of the photoresist pattern which may arise from charge-up may be eliminated.

Other features and advantages of the invention will be apparent from the following description taken in connection with the accompanying drawings.

BRIEF DESCRIPTION OF THE DRAWINGS

FIGS. 2A to 2E and FIGS. 3A to 3B are plan views and sectional views illustrating a process of manufacturing a CMOS IC according to an embodiment of the present invention.

DETAILED DESCRIPTION OF THE PREFERRED EMBODIMENTS

Figure 1A:
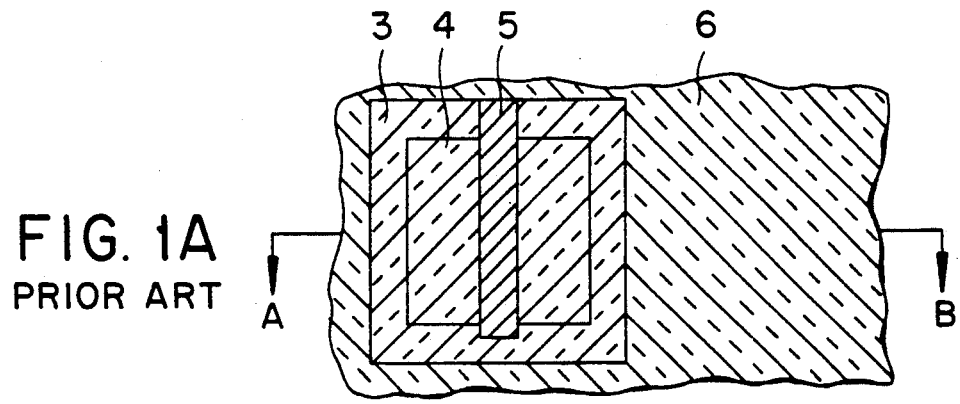
FIGS. 1A to 1D are plan views and sectional views illustrating a process of manufacturing a CMOS IC according to the prior art.
Figure 1B:
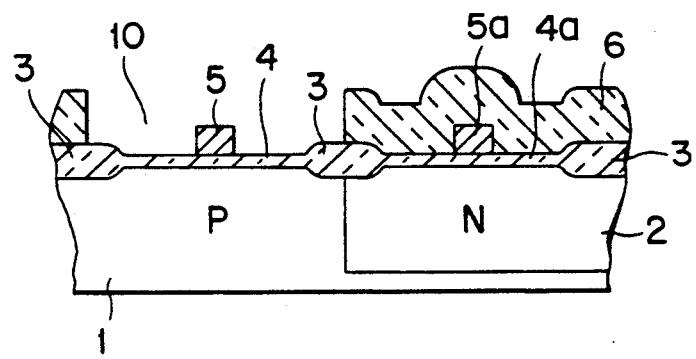
Figure 1C:
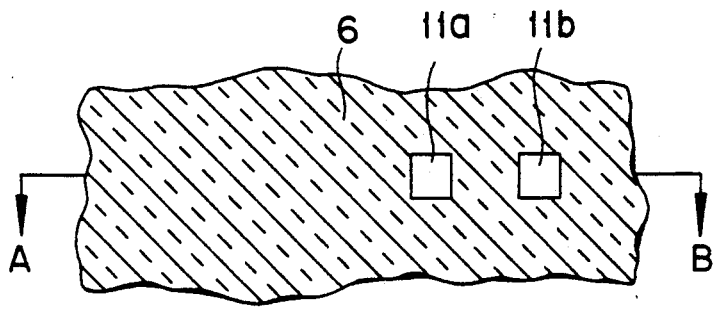
Figure 1D:
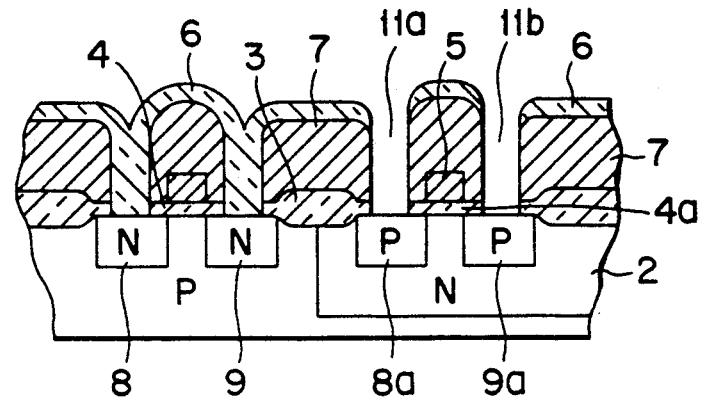
Figure 2A:
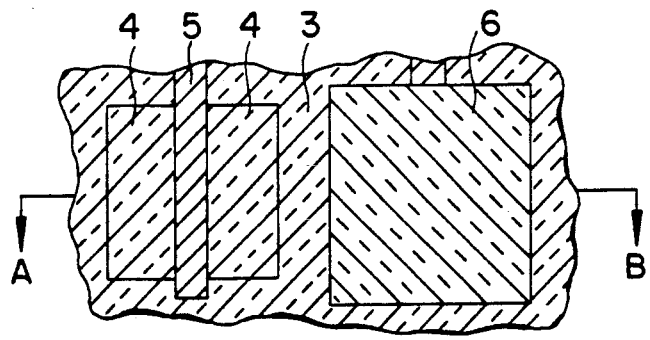
Figure 2B:
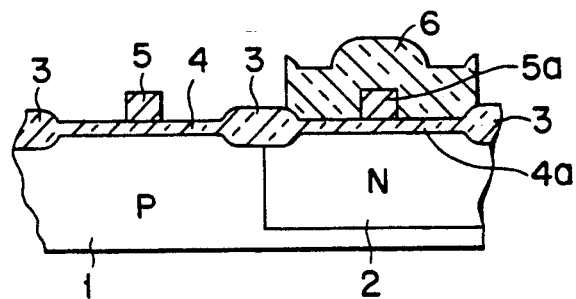

A step of forming a source and a drain of a CMOS IC according to the present invention will be described with reference to FIGS. 2A, 2B, 3A and 3B. FIGS. 2B and 3B are sectional views taken along line A-B of FIGS. 2A and 3A, respectively.

First, N-well 2 is formed on P type silicon substrate 1, and then field oxide film 3 for isolation of elements is formed by LOCOS selective oxidation, whereafter gate oxide films 4 and 4a are caused to grow by thermal oxidation.

Subsequently, polycrystalline silicon film is deposited on the whole wafer surface, and then, phosphor, which is an N type impurity, is introduced into the polycrystalline silicon film by thermal diffusion, whereafter the polycrystalline silicon film is patterned by photolithography and etching to form gate electrodes 5 and 5a.

Here, ion implantation for formation of a source-drain layer is performed. FIGS. 2A, 2B, 3A and 3B show a step of forming a source-drain region of an N channel FET, namely, a step of implanting ions of arsenic. At this time, only the P channel FET area is covered with a photoresist 6 as shown in FIGS. 2A and 3A. Thus, the photoresist mask consists of a plurality of isolated patterns having no opening. Consequently, since there exists a route along which charge will escape on the polystalline silicon film or the oxide silicon film which are not covered with photoresist 6, the breakdown of the gate oxide film due to the charge-up can be prevented.

Figure 2C:
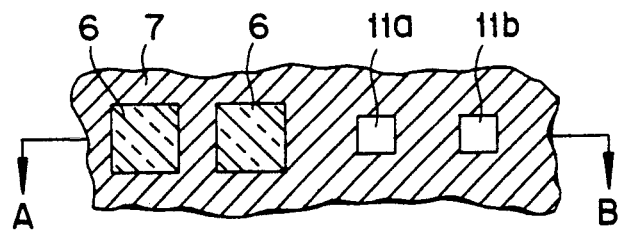
Figure 2D:
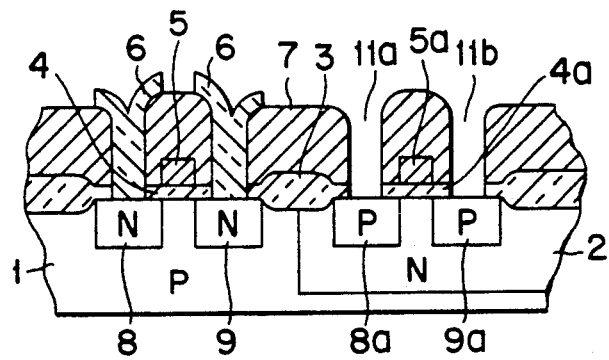
Figure 2E:
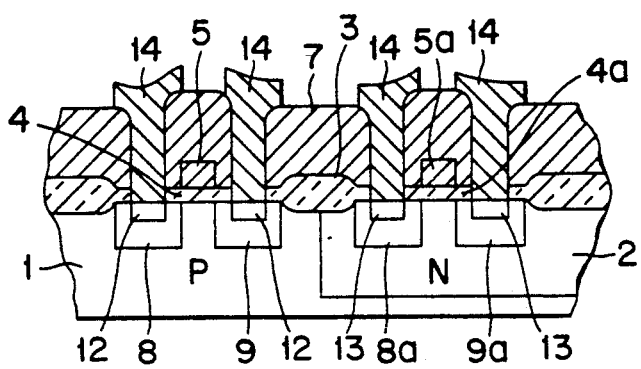

Next, as an embodiment of the present invention, a step of ion implanting for the formation of an ohmic layer in source-drain regions when forming the wiring of a CMOS IC with reference to FIGS. 2C-2E. FIG. 2D is a cross-sectional view taken along line A-B of FIG. 2C.

After sources 8 and 8a and drains 9 and 9a are formed, interlayer insulating film 7 is deposited on the whole wafer main surface, and selective etching is performed to open contact holes for connection of wiring 14, as shown in FIG. 2E. Here, ions of phosphor are implanted into contact holes of the N channel FET area and ions of boron are implanted into contact holes of the P channel area to obtain ohmic contacts between the wiring and sources 8 and 8a and drains 9 and 9a. When ions of phosphor are implanted, contact holes of the P channel FET area are covered with photoresist, and when ions of boron are implanted, contact holes of the N channel FET area are covered with photoresist 6. Since FIG. 2D illustrates an ion implanting step for obtaining ohmic contacts 13 with wiring 14 for the P channel FET, the contact holes of the N channel FET area are covered with photoresist 6.

At this time, only contact holes of the N channel FET area are covered with the photoresist 6 as shown in FIG. 2C. Thus, the photoresist mask consists of a plurality of isolated patterns having no opening. Consequently, since there exists a route along which charge will escape on the interlayer insulating film 7 which is not covered with photoresist 6, the breakdown of the gate oxide film and the photoresist opening pattern due to the charge-up can be prevented.

While the present invention is applied to manufacture of a CMOS IC in the embodiments described above, similar effects can be achieved if the present invention is applied to an ion implanting step for any other semiconductor device.

Ions of arsenic were implanted by an implantation amount (dose) of $5 \times 10^{15}$ cm$^{-2}$ with an acceleration energy of 70 keV in order to form source-drain areas for an N channel FET of a CMOS IC. As a result, while 40% of the gate oxide film was destroyed in the conventional method, the dielectric breakdown of the gate oxide film did not occur in the method of the present invention.

Further, in order to form an ohmic layer for formation of wiring in source-drain areas for an N channel FET of a CMOS IC, ions of phosphor were implanted by an implantation amount (dose) of $3 \times 10^{15}$ cm$^{-2}$ with an acceleration energy of 70 keV. As a result, while photoresist (mask) opening patterns manufactured by a conventional process suffered by 20% from a breakdown, photoresist (mask) opening patterns manufactured by the process of the present invention did not suffer from any breakdown at all because no photoresist mask opening pattern is involved.

While preferred embodiments of the invention have been described using specific terms, such description is for illustration only, and it is to be understood that changes and variations may be made without departing from the spirit or scope of the following claims.

What is claimed is:

1. A process of manufacturing a semiconductor device, comprising the steps of:
    forming a photoresist mask on a main surface of a semiconductor substrate in such a manner that photoresist does not encircle an area in which ions are to be implanted; and
    implanting ions into said area.

2. A process of manufacturing a semiconductor device as set forth in claim 1, wherein, in order to form a source-drain layer for a N channel FET of a CMOS IC, a photoresist mask which covers only the P channel FET area is formed, and ions are implanted.

3. A process of manufacturing a semiconductor device as set forth in claim 1, wherein, in order to form a ohmic layer in source-drain regions of a P channel FET of CMOS IC, a photoresist mask which covers only contact holes of a N channel FET area is formed, and ions are implanted into a contact for the P channel FET.

* * * * *